(12) United States Patent
Takizawa (10) Patent No.: US 6,472,127 B1
(45) Date of Patent: Oct. 29, 2002

(54) METHOD OF FORMING A PHOTORESIST PATTERN

(75) Inventor: Masaharu Takizawa, Tokyo (JP)

(73) Assignee: NEC Corporation, Tokyo (JP)

( * ) Notice: Subject to any disclaimer, the term of this patent is extended or adjusted under 35 U.S.C. 154(b) by 155 days.

(21) Appl. No.: 09/615,055

(22) Filed: Jul. 12, 2000

(30) Foreign Application Priority Data

Jul. 12, 1999 (JP) ............................................ 11-198138

(51) Int. Cl.⁷ ................................................. G03F 7/00
(52) U.S. Cl. ...................................... 430/322; 430/330
(58) Field of Search ................................ 430/327, 311, 430/329, 423, 322, 330

(56) References Cited

U.S. PATENT DOCUMENTS

| 6,251,570 B1 | * | 6/2001 | Phan ........................... 430/327 |
| 2002/0001780 A1 | * | 1/2002 | Lachowski ................... 430/329 |

FOREIGN PATENT DOCUMENTS

| JP | 58-052644 | 3/1983 |
| JP | 63-006548 | 1/1988 |
| JP | 02-270147 | 11/1990 |
| JP | 05-315237 | 11/1993 |
| JP | 06-148896 | 5/1994 |
| JP | 07-140668 | 6/1995 |
| JP | 07-230173 | 8/1995 |
| JP | 07-311467 | 11/1995 |
| JP | 08-078321 | 3/1996 |
| JP | 08-095253 | 4/1996 |
| JP | 11-095448 | 4/1999 |
| JP | 11-162926 | 6/1999 |
| JP | 11-168054 | 6/1999 |

* cited by examiner

Primary Examiner—Kathleen Duda
(74) Attorney, Agent, or Firm—McGinn & Gibb, PLLC (57) ABSTRACT

In order to decrease a development defects even when the blocking level of a chemically amplified photoresist is increased, according to a disclosed photoresist pattern forming method, a photoresist. film (12) made of a chemically amplified photoresist is applied to a semiconductor substrate (11), and after that, before a developing process, an aqueous solution of a surfactant containing a hydrophilic group is applied to the photoresist film (12), so that a surfactant layer (18) is formed.

9 Claims, 10 Drawing Sheets

METHOD OF FORMING A PHOTORESIST PATTERN

BACKGROUND OF THE INVENTION

1. Field of the Invention

The present invention relates to a method of forming a photoresist pattern and, more particularly, to such method which uses a chemically amplified photoresist preferably applied to a method of manufacturing a semiconductor device such as a DRAM.

2. Description of the Prior Art

In the manufacture of semiconductor devices represented by LSIs (Large-Scale Integrated circuits), a photolithography technique is indispensable to patterning various types of thin films including an insulating film, e.g., a silicon oxide film or silicon nitride film formed on a semiconductor substrate, and a conductive film such as an aluminum alloy film or copper alloy film, into a desired shape.

In the photolithograpy technique, conventionally, a photoresist photosensitive to ultraviolet radiation is applied to a thin film to form a photoresist film, and after that ultraviolet radiation is irradiated (exposed) to the photoresist film through a mask pattern to convert a region irradiated with ultraviolet radiation to a solubilized (positive) region or to convert a region not irradiated with ultraviolet radiation to a solubilized (negative) region. Subsequently, the photoresist film is developed, and the solubilized region is partly removed with a solvent to form a resist pattern. Then, the thin film is selectively etched using the resist pattern as a mask to pattern the thin film.

As the material of the photoresist described above, a positive novolac-based photoresist is generally, conventionally used. Since the positive photoresist has a higher resolution than that of a negative photoresist, most of photoresists of the type described above are of a positive type. As an exposure light source for the photoresist, a high pressure mercury lamp is used, and ultraviolet radiation, e.g., a g line (with a wavelength of substantially 436 nm) and an i line (with a wavelength of substantially 365 nm), generated by the high pressure mercury lamp is utilized.

As the integration degree of LSIs increases, a photolithography technique capable of a finer process is required, and accordingly the exposure light source for the photoresist tends to use ultraviolet radiation with a shorter wavelength with which a high resolution can be obtained. As a result, a photolithography technique using an excimer laser which generates far-ultraviolet radiation with a shorter wavelength than that of the i line described above as the light source (for example, when KrF (krypton fluoride) is used as the laser medium, the wavelength is substantially 248 nm) has been realized.

When the novolac-based photoresist described above is exposed by the KrF excimer laser light source described above, as the novolac-based photoresist absorbs a large quantity of light, a good resist pattern is difficult to obtain. Hence, as a photoresist which can realize a photolithograpy technique capable of a finer process in combination with a light source that can obtain far-ultraviolet radiation as described above, for example, a chemically amplified photoresist as described in Japanese Examined Patent Publication No. 2-27660 has been proposed.

A chemically amplified photoresist is a photoresist to which acid catalyst reaction is applied, as described in the above reference, and is roughly comprised of a base resin, e.g., polyhydroxystyrene (PHS), which becomes insoluble to alkali when protection groups are coupled to its predetermined portion and soluble to alkali when protection groups are free from its predetermined portion, an optical acid generating agent which generates hydrogen ions (acid) upon irradiation with light, a very small amount of additive for performance adjustment, and an organic solvent for spinner coating.

This chemically amplified photoresist is applied to a semiconductor substrate, dried, and solidified, and far-ultraviolet radiation emitted from an excimer laser as a light source irradiates a photoresist film on the obtained semiconductor substrate. Then, the optical acid generating agent generates hydrogen ions serving as the trigger species of chemical amplification. The hydrogen ions substitute the protection groups coupled to the base resin during a post exposure bake (PEB) process performed after exposure, so that the protection groups are eliminated. The photoresist which is insoluble to alkali is thus changed to be soluble to alkali. Also, since hydrogen ions are generated subsidiarily during this process, a chain reaction for eliminating the protection groups from the base resin progresses. This reaction is called an acid catalyst sensitization reaction. This acid catalyst sensitization reaction increases the solubility selectivity of the photoresist, so that highly photosensitive characteristics can be realized. Therefore, after exposure, if this photoresist is developed with an alkali developer, a desired very fine resist pattern can be obtained.

Figure 1:
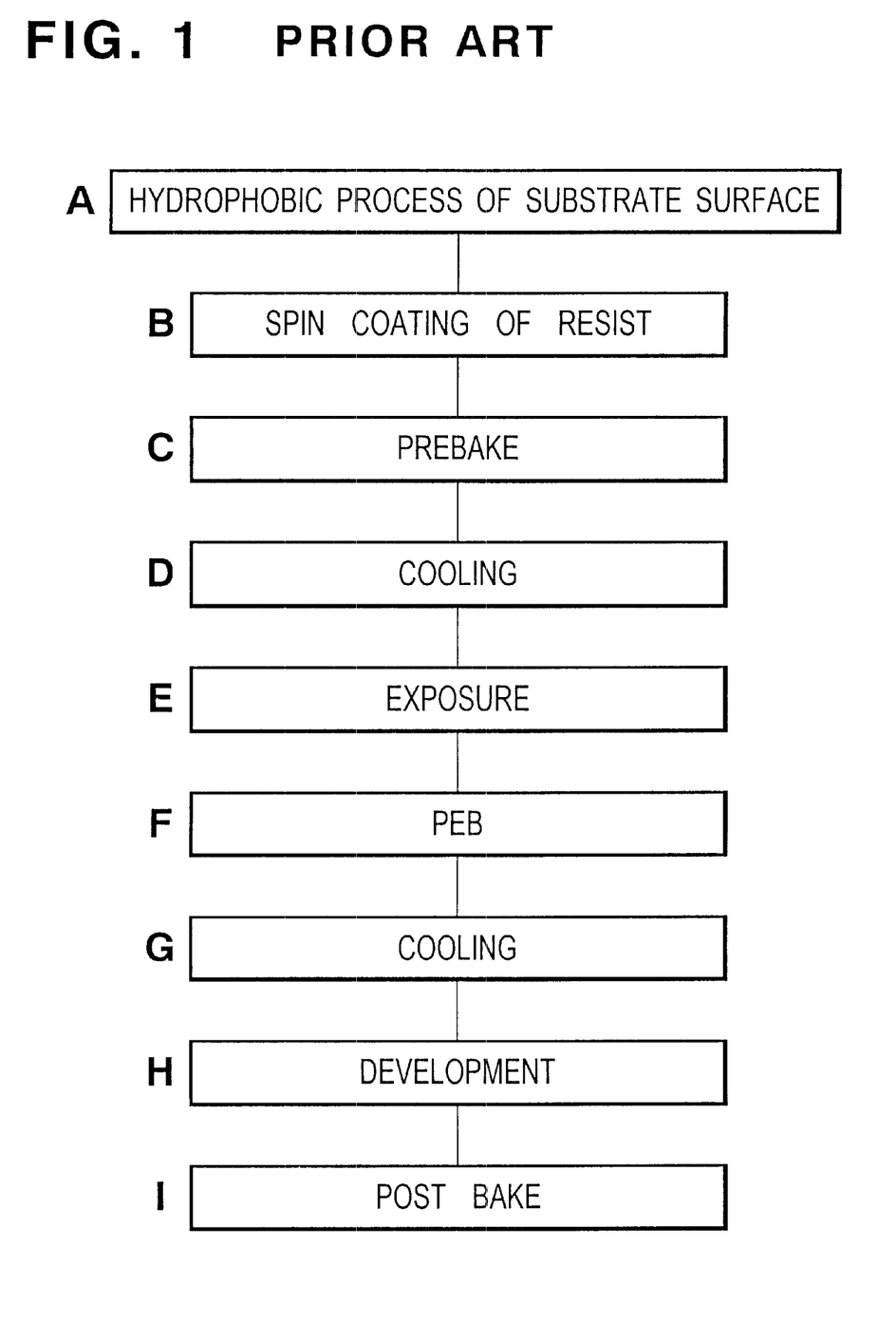
FIG. 1 is a flow chart showing a conventional photoresist pattern forming method in the order of steps.

FIG. 1 is a process view showing a conventional method of forming a photoresist pattern using the chemically amplified photoresist described above in the order of steps. This photoresist pattern forming method will be described in the order of steps with reference to FIG. 1.

As shown in step A of FIG. 1, the surface of a semiconductor substrate having a desired thin film, where a photoresist pattern is to be formed, is subjected to a hydrophobic process, so that the adhesion of the photoresist is increased. As shown in step B, for example, a positive photoresist made of a chemically sensitizable type photoresist, containing a base resin formed of polymer compounds having a terpolymer structure as shown in formula (1) and an optical acid generating agent with a structure as shown in formula (2), is applied to the semiconductor substrate in accordance with spin coating, thereby forming a photoresist film.

-continued (2)

Subsequently, as shown in step C of FIG. 1, the photoresist film is prebaked to remove the solvent from it. The semiconductor substrate is cooled to room temperature, as shown in step D, and the photoresist film is irradiated with far-ultraviolet radiation from, e.g., a KrF excimer laser, through a mask pattern drawn with a desired pattern, to expose it, as shown in step E. The photoresist film is then subjected to a PEB (Post Exposure Bake) process to promote elimination reaction (acid catalyst sensitization reaction) of eliminating the protection groups from the photoresist film, as shown in step F.

The semiconductor substrate is then cooled again to room temperature, as shown in step G of FIG. 1, and the photoresist film is developed with an alkali developer to form a resist pattern, as shown in step H. The photoresist film that forms the resist pattern is post-baked to remove the water content produced by development, as shown in step I.

Subsequently, the thin film on the semiconductor substrate is selectively etched by using the resist pattern described above as a mask to pattern the thin film.

When a photoresist pattern is to be formed by using a chemically amplified photoresist, in recent semiconductor devices, a focal depth S must be set to about 0.7 μm or more so that the manufacturing yield is increased. The focal depth S depends on a blocking level C of the employed photoresist. The blocking level C is determined by a ratio of numbers x, y, and z of repeating units in the formula (1) described above, and is expressed as:

Blocking level $C=((x+y)/(x+y+z))\times 100(\%)$

Figure 4:
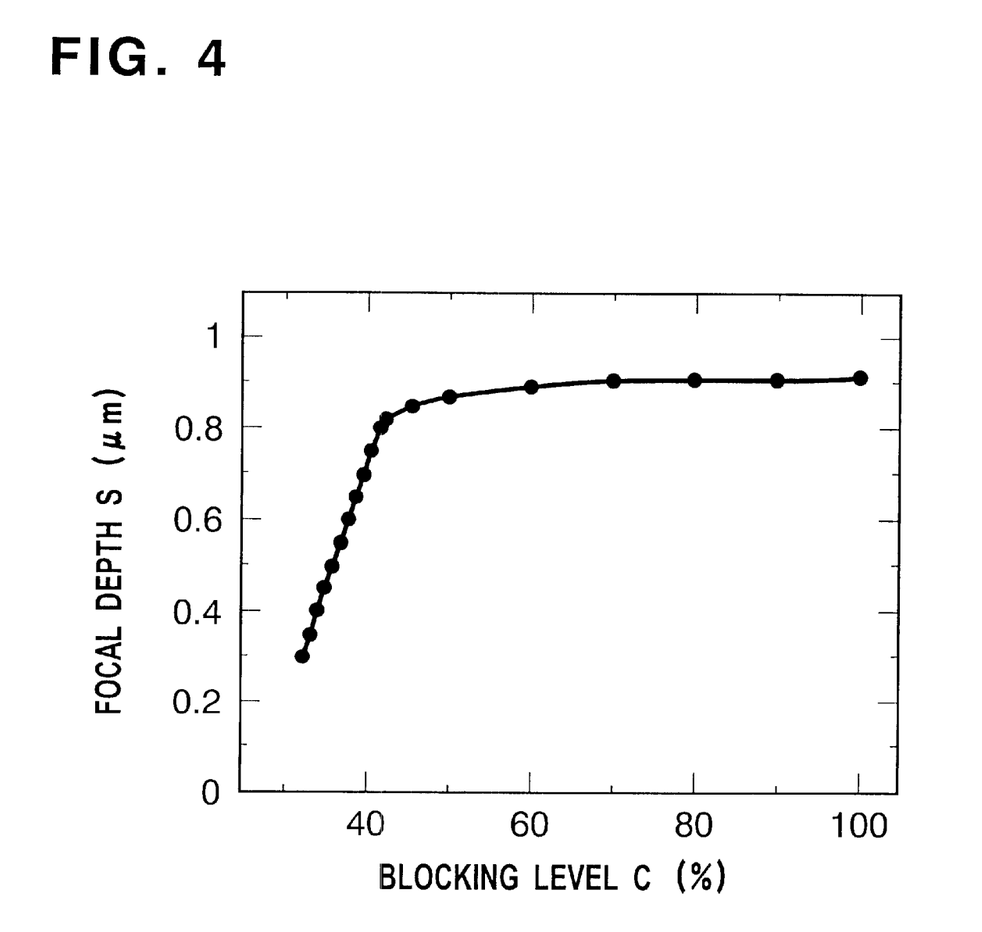
FIG. 4 is a graph for explaining the background in which the present invention is required.

FIG. 4 is a graph for explaining the relationship between the focal depth S (axis of ordinate) and the blocking level C (axis of abscissa). In the example shown in FIG. 4, a photoresist pattern having a contact hole with a diameter of 0.2 μm is formed. As is apparent from FIG. 4, the focal depth S increases linearly proportionally where the blocking level C falls within a range of about 42%, but tends to saturate gradually when the blocking level C exceeds about 42%. In order to obtain the focal depth S of 0.7 μm or more as described above, the blocking level C must be increased to about 40% or more.

In the conventional photoresist pattern forming method described above, when a chemically amplified photoresist with an increased blocking level is used, development defects increase.

Figure 2:
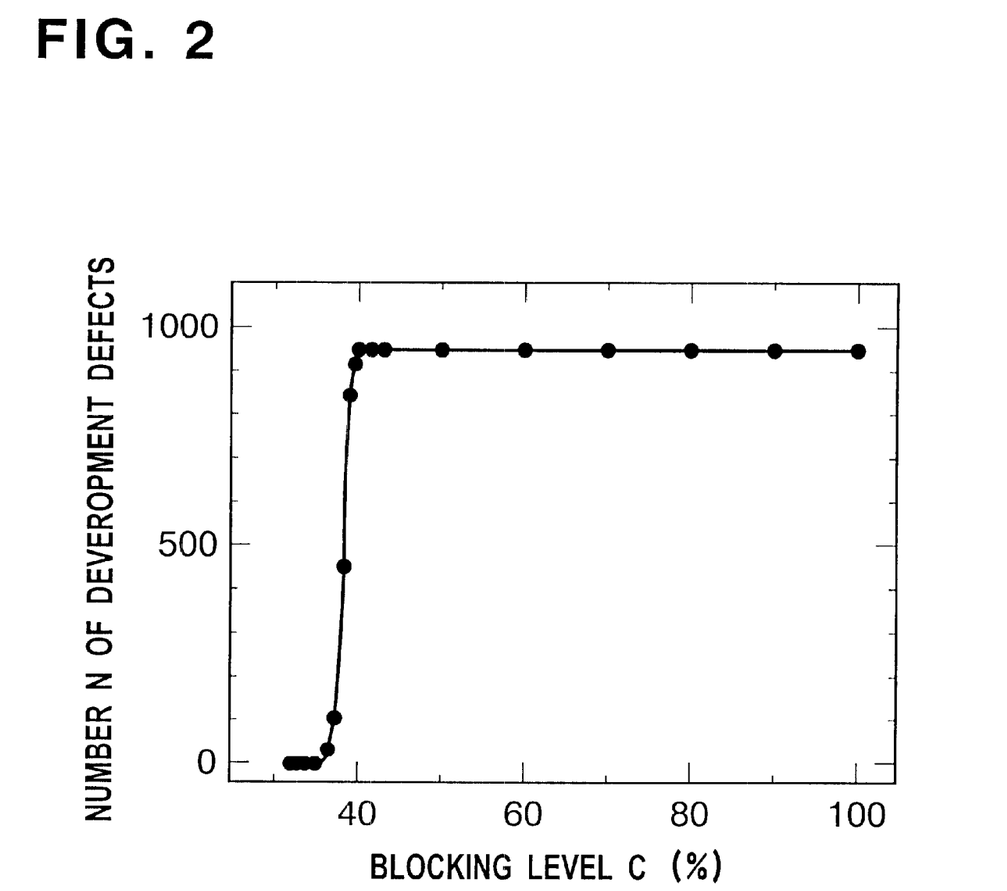
FIG. 2 is a graph for explaining a drawback caused by this photoresist pattern forming method.

More specifically, as described above, when a photoresist pattern is formed by performing exposure and development by using a chemically amplified photoresist with the increased blocking level C of about 42% or more in order that the focal depth S is set to about 0.7 μm or more, many defects are formed during development. FIG. 2 shows these defects by exhibiting a relationship between the number N (axis of ordinate) of development defects and the blocking level C. As is apparent from FIG. 2, the number N of development defects increases sharply as the blocking level C exceeds about 38%, until reaching as many as almost 1,000. If these many development defects N exist in a photoresist pattern in this manner, this pattern is defective.

Figure 3:
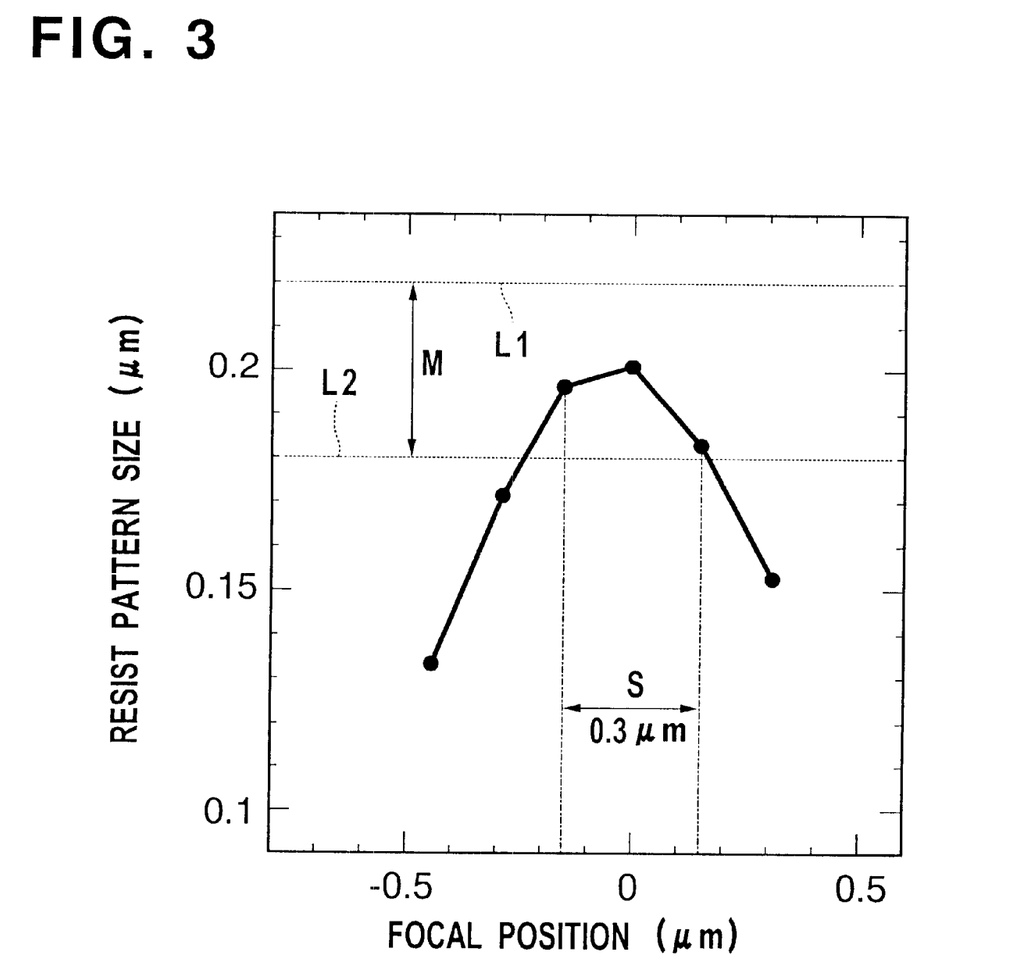
FIG. 3 is a graph for explaining a drawback caused by this photoresist pattern forming method.

Therefore, conventionally, the focal depth S of about 0.45 μm or less corresponding to the blocking level C of about 38% or less can only be obtained, as is apparent from FIG. 4, and a decrease in manufacturing yield cannot be avoided. FIG. 3 shows this conventional drawback in more detail by exhibiting a relationship between a resist pattern size (axis of ordinate) and a focal position (axis of abscissa), and explains a case wherein a contact hole with a diameter of 0.2 μm is to be formed. A range M defined by broken lines L1 and L2 shows the allowable range of the target contact hole. FIG. 3 shows that the focal depth S of 0.3 μm can only be obtained centered on a focal position of 0 μm.

Conventionally, when the blocking level is increased, development defects increase. This is supposed to be due to the following reason. Since the chemically amplified photoresist used in the conventional photoresist pattern forming method is highly hydrophobic, a component solved by the development may attach to the photoresist film again to cause a development defect.

SUMMARY OF THE INVENTION

The present invention has been made in view of the above situation, and has as its object to provide a method of forming a photoresist pattern which can suppress development defects even if the blocking level of a chemically amplified photoresist is increased.

In order to achieve the above problem, according to the present invention of claim 1, there is provided a method of forming a photoresist pattern which comrises the steps of coating a chemically amplified photoresist containing an optical acid generating agent onto a substrate to form a photoresist film, subjecting said photoresist film formed in said coating step to predetermined patterning exposure, performing a PEB process (post-exposure bake process) on said photoresist film to promote acid catalyst sensitization reaction within an exposed region of a whole region of said photoresist film, and developing said photoresist film which has been subjected to the PEB process step, to obtain a photoresist pattern with a desired shape, characterized by a step of applying a defect preventive agent containing a hydrophobic group and a hydrophilic group to said photoresist film after said photoresist film is formed by coating but before developed.

The invention according to claim 2 relates to the photoresist pattern forming method according to claim 1. In claim 2, the defect preventive agent is applied before the exposure step.

The invention according to claim 3 relates to the photoresist pattern forming method according to claim 1. In claim 3, the defect preventive agent is applied after the exposure step.

In the invention according to claim 4, the defect preventive agent is applied to the photoresist film after a cooling step.

The invention according to claim 5 relates to the photoresist pattern forming method according to claim 1, 2, or 3. In claim 5, a surfactant is used as the defect preventive agent.

The invention according to claim 6 relates to the photoresist pattern forming method according to claim 5. In claim 5, the surfactant contains a carbon fluoride group or dimethylpolysiloxane group.

The invention according to claim 7 relates to the photoresist pattern forming method according to claim 5. In claim 7, the surfactant is applied by spin coating.

The invention according to claim 8 relates to the photoresist pattern forming method according to any one of claims 1 to 7. In claim 8, the chemical amplificaion type photoresist has a blocking level of 38% to 100%.

The invention according to claim 9 relates to the photoresist pattern forming method according to claim 8. In claim 9, the chemically amplified photoresist contains a polymer compound having a terpolymer structure.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF THE PREFERRED EMBODIMENTS

The preferred embodiments of the present invention will be described with reference to the accompanying drawings. The description will be made in detail through embodiments.

First Embodiment

Figure 5:
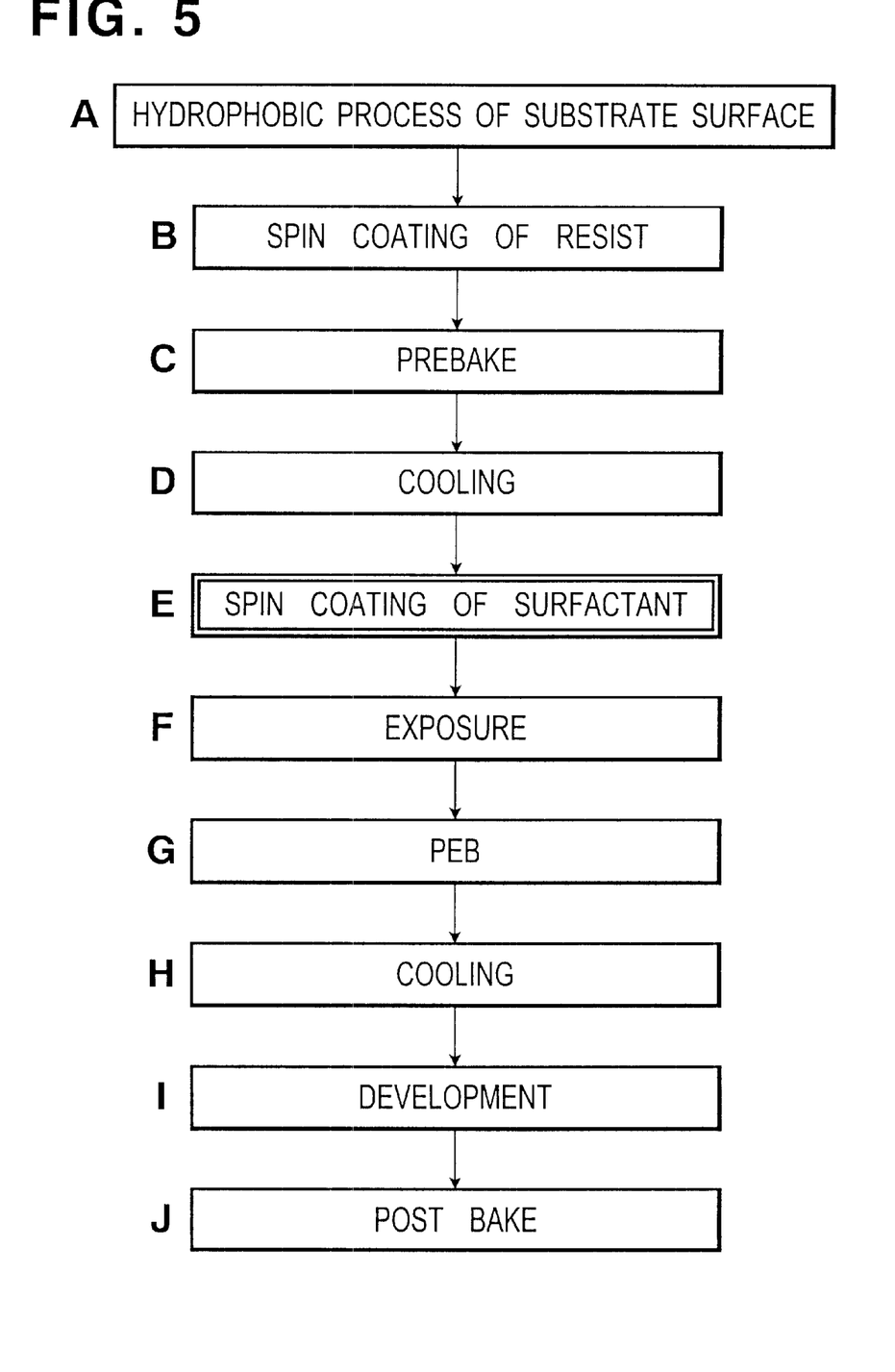
FIG. 5 is a flow chart showing a photoresist pattern forming method according to the first embodiment of the present invention in the order of steps.
Figure 6:
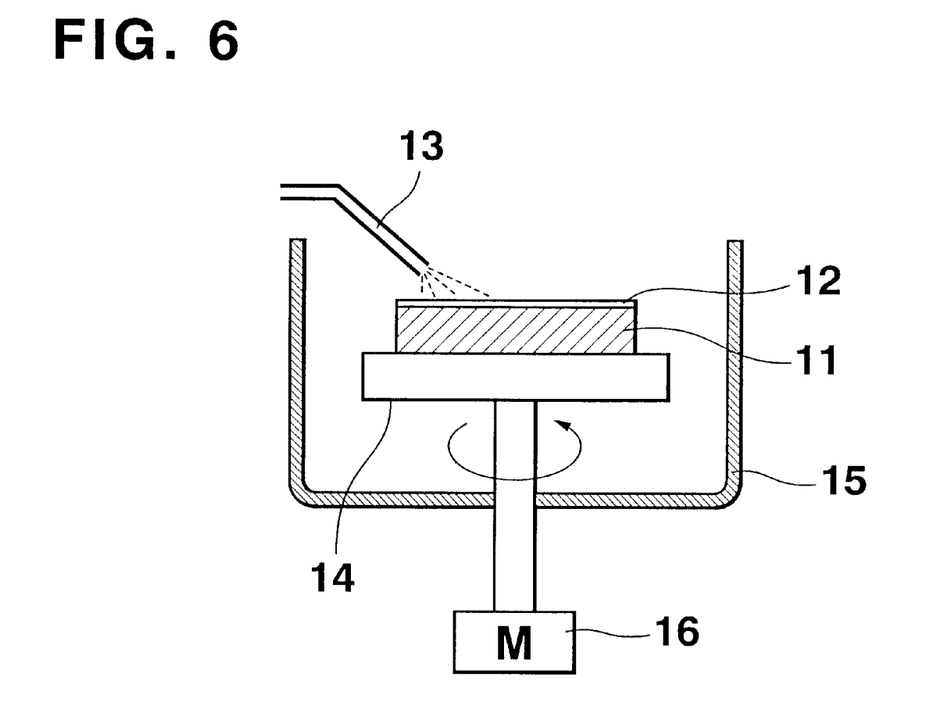
FIG. 6 is a view showing the main step of this photoresist pattern forming method in detail.
Figure 7:
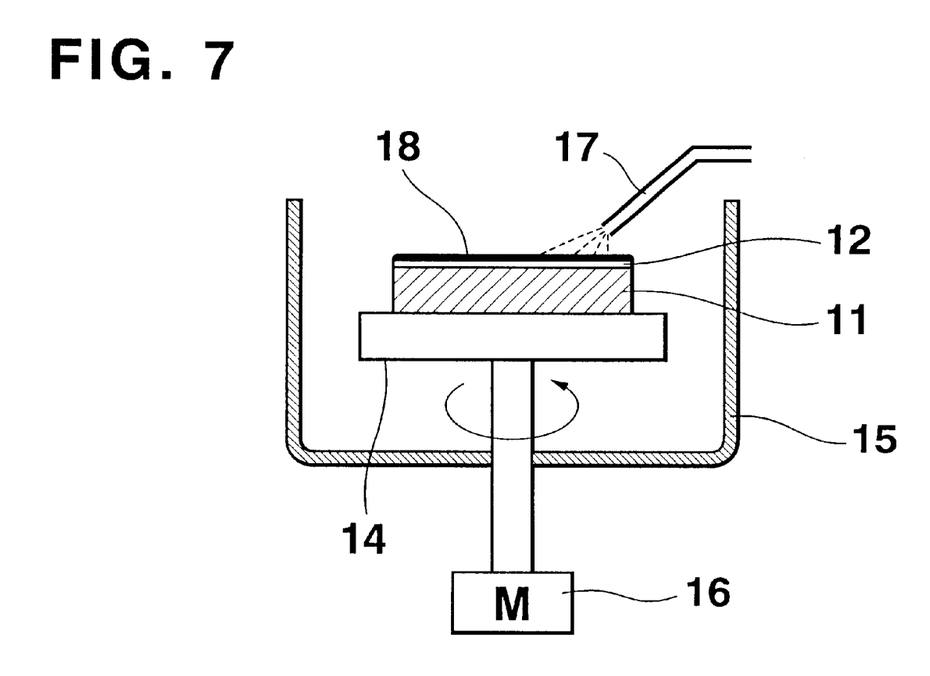
FIG. 7 is a view showing the main step of this photoresist pattern forming method in detail.
Figure 8:
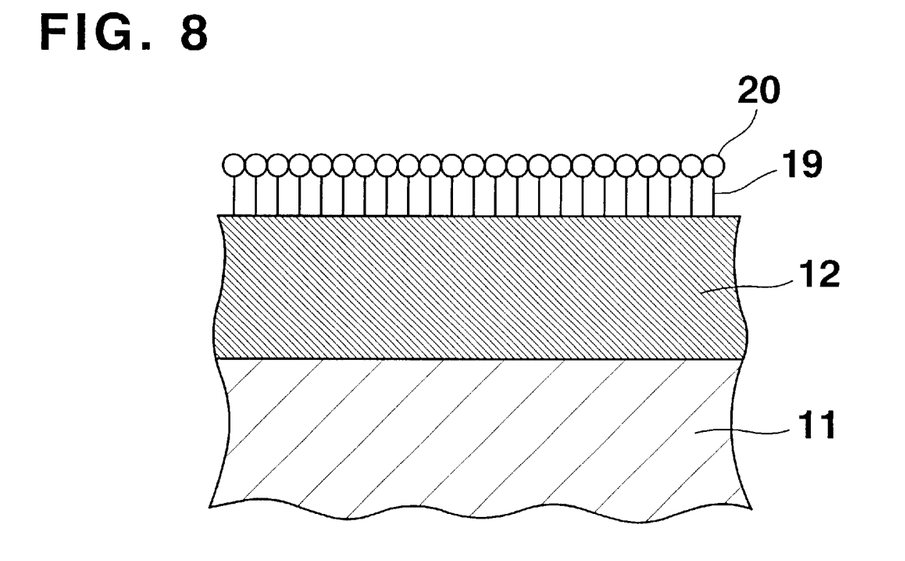
FIG. 8 is a view for briefly explaining the operation of this photoresist pattern forming method.
Figure 9:
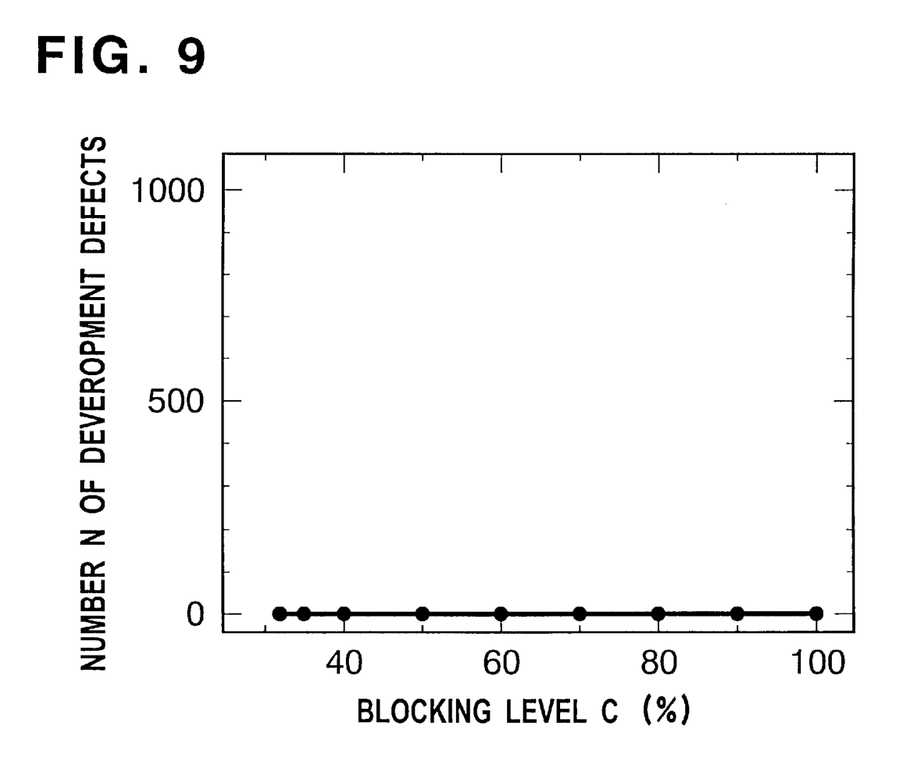
FIG. 9 is a graph showing an effect obtained by this photoresist pattern forming method.
Figure 10:
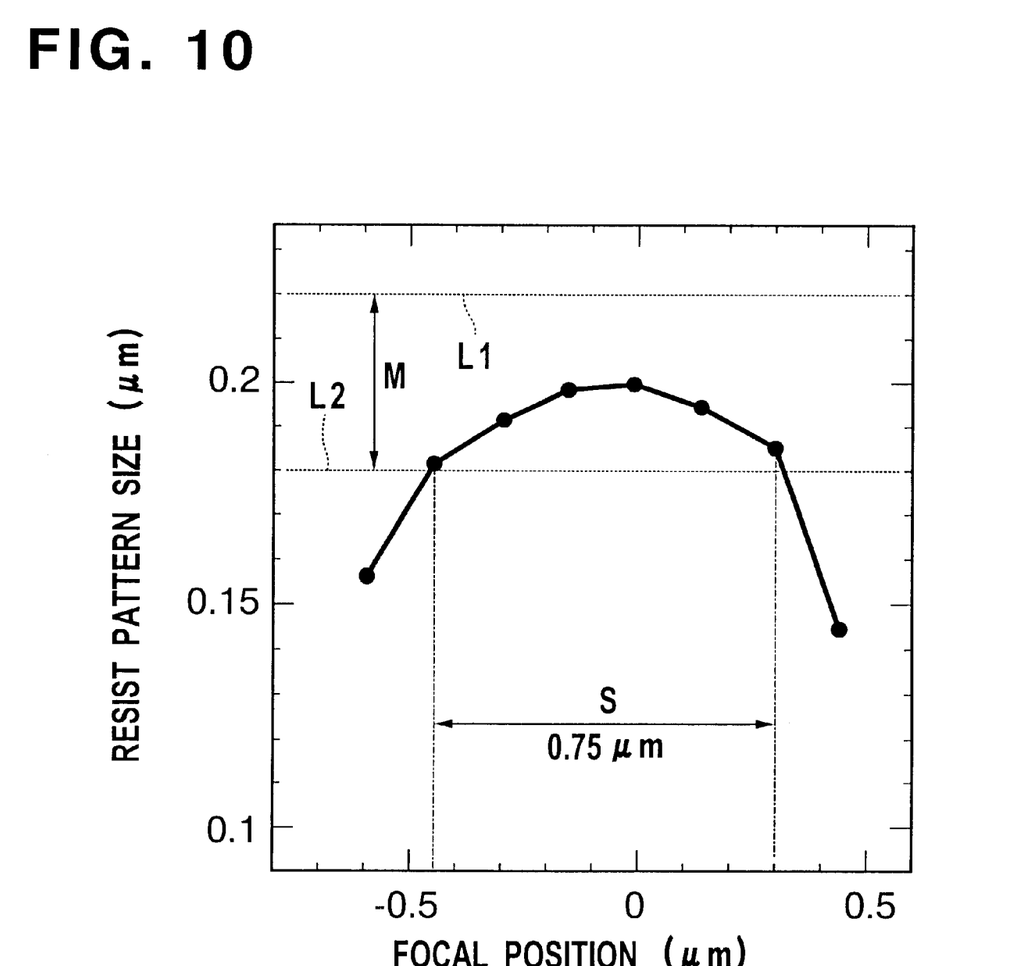
FIG. 10 is a graph showing an effect obtained by this photoresist pattern forming method.

FIG. 5 is a flow chart showing a photoresist pattern forming method according to the first embodiment of the present invention in the order of steps, FIGS. 6 and 7 are views showing the main steps of this photoresist pattern forming method in detail, FIG. 8 is a view for briefly explaining the operation of this photoresist pattern forming method, and FIGS. 9 and 10 are graphs showing effects obtained by this photoresist pattern forming method.

The photoresist pattern forming method of this embodiment is applied to a method of manufacturing a semiconductor device such as a DRAM. This photoresist pattern forming method will be described in the order of steps with reference to FIGS. 5 to 10.

As shown in step A of FIG. 5, a semiconductor substrate having a desired thin film, where a photoresist pattern is to be formed, is exposed to a hexamethyldisilazane (HMDS) atmosphere to subject its surface to a hydrophobic process, in order to increase the adhesion of the photoresist.

As shown in step B of FIG. 5, a positive photoresist is applied to the semiconductor substrate in accordance with spin coating to form a photoresist film. FIG. 6 is a view showing this photoresist coating step.

As shown in FIG. 6, a semiconductor substrate 11 is supported on a support plate 14 provided in a developer tank 15 of a resist developing unit and rotatably driven by a motor 16. For example, a positive photoresist made of a chemically amplified photoresist, containing a base resin formed of macromolecular compounds having a terpolymer structure as shown in formula (1) and an optical acid generating agent with a structure as shown in formula (2), is supplied from a nozzle 13 and applied to the semiconductor substrate 11 in accordance with spin coating by the motor 16 at 2,000 rpm (revolutions per minute) to 4,000 rpm, thereby forming a photoresist film 12 with a thickness of about 500 nm. As the photoresist film 12, one with a blocking level of about 35% or more is used.

Subsequently, as shown in step C of FIG. 5, the photoresist film 12 formed by coating in the above manner is prebaked in the atmosphere at 80° C. to 130° C. for 60 sec to 90 sec to remove the solvent from it. The semiconductor substrate 12 is then cooled for 60 sec to 90 sec to room temperature of about 23° C., as shown in step D of FIG. 5.

As shown in step E of FIG. 5, a surfactant serving as a defect preventive agent containing hydrophilic groups is applied to the photoresist film 12 on the semiconductor substrate 11 by spin coating. FIG. 7 shows this surfactant coating step.

As shown in FIG. 7, the semiconductor substrate 11 coated with the photoresist film 12 is supported on the support plate 14, and an aqueous solution of a surfactant containing carbon fluoride groups having a structure as shown in formula (3) is supplied from a nozzle 17 and applied to the photoresist film 12 by spin coating with the motor 16 at 2,000 rpm to 4,000 rpm to form a surfactant layer 18 of a monomolecular or polymolecular film on the surface of the photoresist film 12.

Consequently, as shown in FIG. 8, hydrophobic groups 19 of the surfactant attach to the surface of the photoresist film 12, and hydrophilic groups 20 also attach to the hydrophobic groups 19. Hence, the surface of the photoresist film 12 changes to be hydrophilic. During development (to be described later), reattachment of a developing solvent component to the surface of the photoresist film 12 is moderated, so that developing defects are suppressed even when the blocking level is increased. In FIG. 8, the hydrophobic groups 19 and hydrophilic groups 20 are monomolecular films.

(3)

As shown in step F of FIG. 5, the photoresist film 12 is irradiated with far-ultraviolet radiation with a wavelength of about 193 nm from, e.g., a KrF excimer laser, through a mask pattern drawn with a desired pattern to expose it, as shown in step F of FIG. 5.

The photoresist film 12 is then subjected to a PEB process at 90° C. to 160° C. for 60 sec to 90 sec to promote elimination reaction of the protection groups from the photoresist film 12, as shown in step G of FIG. 5. The semiconductor substrate 11 is then cooled again for 60 sec to 90 sec to room temperature of about 23° C., as shown in step H of FIG. 5.

Then, the photoresist film 12 is developed as shown in step I of FIG. 5. This development is performed by applying, e.g., an aqueous solution containing about 2.38% of tetramethylammoniumhydroxide (TMAH), as an alkali developer to the photoresist film 12 on the semiconductor substrate 11 in accordance with spin coating. In this development, the surface of the photoresist film 12 is hydrophilic as the surfactant layer 18 containing the hydrophilic groups is formed on it in advance by coating. Therefore, reattachment of the developing solvent component is relaxed.

By the above development, the soluble region of the photoresist film 12 is removed by the alkali developer, and a resist pattern with a desired shape corresponding to the mask pattern (described above) is formed.

As shown in step J of FIG. 5, the photoresist film 12 constituting the resist pattern is prebaked in the atmosphere at 110° C. to 120° C. for 120 sec to 240 sec to remove the water produced by development.

Subsequently, the thin film on the semiconductor substrate 11 is selectively etched by using the resist pattern (described above) as a mask, thereby patterning the thin film.

FIG. 9 is a graph showing the relationship between the number N (axis of ordinate) of development defects and a blocking level C obtained by this embodiment. As is apparent from FIG. 9, the number N of development defects is greatly decreased to a one place number of up to several defects, as it does not almost increase even if the blocking level C is increased to about 100%. The demand described above for setting a focal depth S to about 0.7 μm or more can be satisfied sufficiently, and the manufacturing yield of the semiconductor device can be improved. In other words, when a surfactant serving as a defect preventive agent containing hydrophilic groups is applied to the photoresist film 12, development defects can be almost eliminated.

In this manner, even if the blocking level C is increased, the development defects decrease greatly. This is because after the photoresist film 12 is formed by coating, an aqueous solution of the surfactant containing hydrophilic groups is applied to the surface of the photoresist film 12 to form the surfactant layer 18. Then, the hydrophilic groups influence the photoresist film 12 to change its surface to be hydrophilic.

FIG. 10 is a graph showing the relationship between the resist pattern size and the focal position obtained by this embodiment. As is apparent from comparison with FIG. 3, in FIG. 10, the focal depth S of 0.75 μm can be obtained centered on the focal position "0", and this embodiment is thus superior to the prior art.

In this manner, according to the embodiment having this arrangement, the photoresist film 12 comprising the chemically amplified photoresist is applied to the photoresist film 12, and after that, before the PEB process that promotes elimination reaction of the protection groups from the photoresist film 12, the surfactant layer 18 containing the hydrophilic groups is formed on the photoresist film 12 by coating. Therefore, the surface of the photoresist film 12 can be changed to be hydrophilic.

Hence, even when the blocking level of the chemically amplified photoresist is increased, the development defects can decrease.

Second Embodiment

Figure 11:
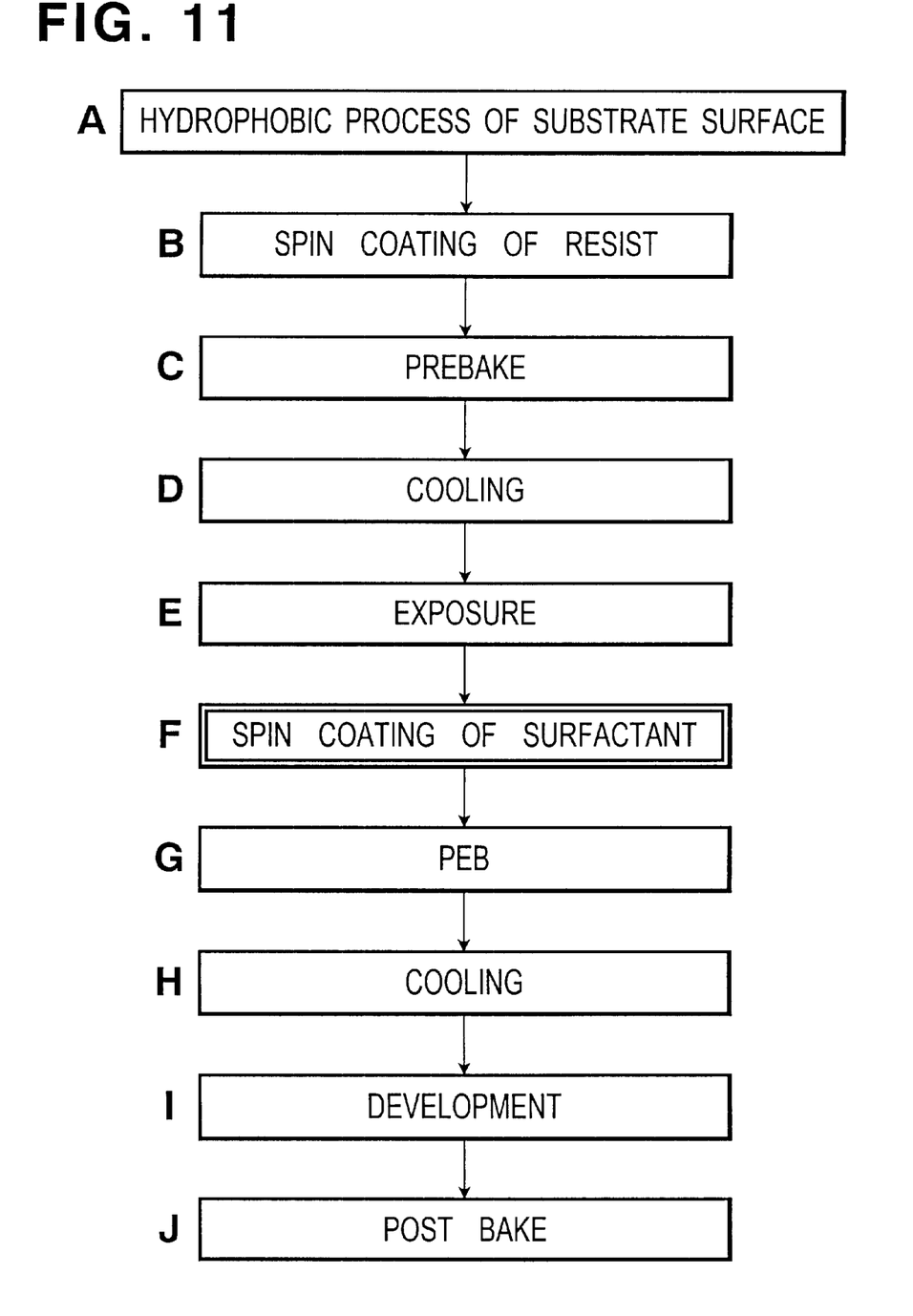
FIG. 11 is a flow chart showing a photoresist pattern forming method according to the second embodiment of the present invention in the order of steps.

FIG. 11 is a flow chart showing a photoresist pattern forming method according to the second embodiment of the present invention in the order of steps. This photoresist pattern forming method is largely different from that of the first embodiment described above in that an aqueous solution of a surfactant is applied after exposure of the photoresist film.

More specifically, in step B of FIG. 11, a photoresist film 12 is formed under almost the same conditions as those in step B of FIG. 5 which shows the first embodiment. In step E of FIG. 11, exposure is performed under almost the same conditions as those in step F of FIG. 5 which shows the first embodiment. Then, in step F of FIG. 11, a surfactant serving as a defect preventive agent containing hydrophilic groups is applied under almost the same conditions as those in step E of FIG. 5 which shows the first embodiment.

Figure 12:
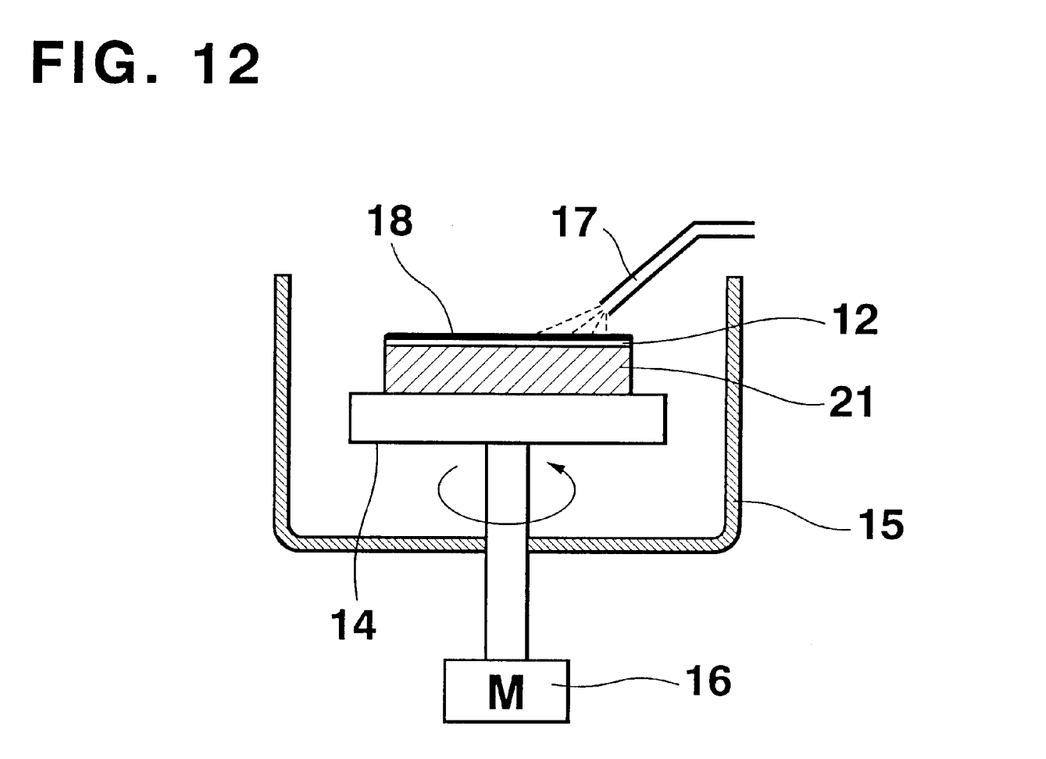
FIG. 12 is a view showing the main step of this photoresist pattern forming method in detail.

More specifically, as shown in step F of FIG. 11, a semiconductor substrate 21 which has been exposed is supported on a support plate 14 in a developer tank 15 as shown in FIG. 12. For example, an aqueous solution of a surfactant containing carbon fluoride groups with a structure as shown in formula (3) is supplied from a nozzle 17 and applied to the semiconductor substrate 21 by spin coating with a motor 16 at 2,000 rpm to 4,000 rpm. The aqueous solution of the surfactant is applied to the surface of the photoresist film 12 to a thickness of about 30 nm, thereby forming a surfactant layer 18.

The hydrophilic groups constituting the surfactant layer 18 influence the underlying photoresist film 12 with the same principle as that in the first embodiment, to change the surface of the photoresist film 12 to be hydrophilic. During development in later step I, reattachment of the developing solvent component to the surface of the photoresist film 12 is relaxed. Therefore, even when the blocking level is increased, the development defects can decrease.

According to this embodiment, the aqueous solution of the surfactant is applied after exposure. While applying the aqueous solution of the surfactant, even if a defect attaches to the surface of the underlying photoresist film 12, it will not be transferred to the surface of the photoresist film 12 as it attaches to the surface of the photoresist film 12 after exposure. As a result, formation of a defective photoresist pattern can be prevented. In addition, this defect can be removed easily during later development.

In this manner, with the arrangement of this embodiment as well, almost the same effect as that described in the first embodiment can be obtained.

In addition, according to the arrangement of this embodiment, since exposure does not influence the photoresist film, formation of a defective photoresist pattern can be prevented.

Third Embodiment

In this embodiment, dimethylpolysiloxane groups with a structure as shown in formula (4) are used in place of carbon fluoride groups contained in the aqueous solution of the surfactant in the first embodiment.

In this embodiment as well, after a photoresist film 12 is applied, an aqueous solution of a surfactant containing dimethylpolysiloxane groups is applied to the surface of the photoresist film 12 to form a surfactant layer 18. The hydrophilic groups of the dimethylpolysiloxane groups influence the photoresist film 12 to change its surface to be hydrophilic.

Except for this, the arrangement of the third embodiment is substantially the same as that of the first embodiment described above. Hence, in FIG. 11, portions corresponding to the constituent portions in FIG. 5 are denoted by the same step letters as in FIG. 5, and a detailed description thereof will be omitted.

In this manner, with the arrangement of this embodiment as well, almost the same effect as that described in the first embodiment can be obtained.

Fourth Embodiment

In this embodiment, dimethylpolysiloxane groups with a structure as shown in formula (4) described above are used in place of carbon fluoride groups contained in the aqueous solution of the surfactant in the second embodiment.

In this embodiment as well, after a photoresist film 12 is applied and exposed, an aqueous solution of a surfactant containing dimethylpolysiloxane groups is applied to the surface of the photoresist film 12 to form a surfactant layer 18. The hydrophilic groups of the dimethylpolysiloxane groups influence the photoresist film 12 to change its surface to be hydrophilic.

In this manner, with the arrangement of this embodiment as well, almost the same effect as that described in the second embodiment can be obtained.

The embodiments of the present invention have been described in detail with reference to the accompanying drawings. Note that the practical arrangement is not limited to these embodiments, but any design change within a scope not departing from the spirit of the present invention is incorporated in the present invention. For example, formation of a photoresist pattern using a chemically amplified photoresist is not limited to a case for a semiconductor substrate, but can be applied to a case for other substrates such as a photomask substrate. The surfactant is not limited to one containing carbon fluoride groups or dimethylpolysiloxane groups, but the following many other surfactants can be used. Note that R denote various types of alkyl groups.

(1) Anionic Surfactant (5)

(6)

(7)

(8)

RCOONa     (9)

ROSO₃NA     (10)

(11)

(12)

(13)

(2) Cationic Surfactant

(14)

(15)

(16)

(17)

(18)

(19)

(3) Ampholytic Surfactant

(20)

(21)

-continued (22)

(4) Nonionic Surfactant (23)

(24)

(25)

(26)

RCONHCH$_2$CH$_2$OH (27)

(28)

In the embodiments as described above, the defect preventive agent is applied to a photoresist film after formation of the photoresist film but before PEB process. However application of the defect preventive agent may be performed after formation of the photoresist film before development. process and preferably between the cooling step H and the developing step I.

The chemically amplified photoresist is not limited to those discussed above, but any material with a blocking level of about 38% or more, at which a development defect is formed, can be used similarly. The chemically amplified photoresist is not limited to a positive photoresist, but can be a negative photoresist. Conditions such as the spin coating method of the photoresist film, the spin coating method of the aqueous solution of the surfactant, and the temperature, time, and the like in prebake, the PEB process, post-bake, and the like are merely examples, and can be changed in accordance with the application, object, and the like.

As has been described above, according to the photoresist pattern forming method of the present invention, the photoresist film comprising the chemically amplified photoresist is applied to the substrate, and after that, before the developing, process an aqueous solution of a surfactant containing hydrophilic groups is applied to the photoresist film by coating. Therefore, the surface of the photoresist film can be changed to be hydrophilic.

According to another photoresist pattern forming method of the present invention, the photoresist film comprising the chemically amplified photoresist is applied to the substrate, and after that, after an exposure step and before the developing process, an aqueous solution of a surfactant containing hydrophilic groups is applied to the photoresist film by coating. Therefore, the surface of the photoresist film can be changed to be hydrophilic.

Therefore, even if the blocking level of the chemically amplified photoresist is increased, development defects can decrease.

What is claimed is:

1. A method of forming a photoresist pattern comprising:
    coating a chemically amplified photoresist containing an optical acid generating agent onto a substrate to form a photoresist film;
    subjecting said photoresist film formed in said coating step to predetermined patterning exposure;
    performing a PEB process (post-exposure bake process) on said photoresist film to promote an acid catalyst sensitization reaction within an exposed region of a whole region of said photoresist film, and
    developing said photoresist film which has been subjected to the PEB process, to obtain a photoresist pattern with a desired shape;
    wherein a defect preventive agent containing a hydrophobic group and a hydrophilic group is applied to said photoresist film after said photoresist film is formed by coating but before said developing.

2. A method according to claim 1, wherein said defect preventive agent is applied before the exposure.

3. A method according to claim 1, wherein said defect preventive agent is applied after the exposure.

4. A method according to claim 1, further comprising performing a cooling process after said PEB process, wherein said defect preventive agent is applied after said cooling.

5. A method according to claim 1, wherein a surfactant is used as said defect preventive agent.

6. A method according to claim 5, wherein said surfactant contains a carbon fluoride group or dimethylpolysiloxane group.

7. A method according to claim 5, wherein said surfactant is applied by spin coating.

8. A method according to claim 1, wherein said photoresist has a blocking level of 38% to 100%.

9. A method cording to claim 8, wherein said compound having a terpolymer structure.

* * * * *